United States Patent
Sung

(10) Patent No.: US 8,974,270 B2
(45) Date of Patent: *Mar. 10, 2015

(54) CMP PAD DRESSER HAVING LEVELED TIPS AND ASSOCIATED METHODS

(76) Inventor: Chien-Min Sung, Taipei County (TW)

( * ) Notice: Subject to any disclaimer, the term of this patent is extended or adjusted under 35 U.S.C. 154(b) by 199 days.

This patent is subject to a terminal disclaimer.

(21) Appl. No.: 13/479,148

(22) Filed: May 23, 2012

(65) Prior Publication Data

US 2012/0302146 A1    Nov. 29, 2012

Related U.S. Application Data

(60) Provisional application No. 61/489,074, filed on May 23, 2011.

(51) Int. Cl.
  *B24B 53/12* (2006.01)
  *H01L 21/304* (2006.01)

(52) U.S. Cl.
  CPC .................................. *H01L 21/304* (2013.01)
  USPC ............................ 451/443; 451/444; 451/548

(58) Field of Classification Search
  CPC ............................. B24B 53/12; B24B 53/017
  USPC ............... 451/443, 444, 548, 56; 51/295, 309
  See application file for complete search history.

(56) References Cited

U.S. PATENT DOCUMENTS

| | | |
|---|---|---|
| 187,593 A | 2/1877 | Brown et al. |
| 1,854,071 A | 4/1932 | Schacht |
| 1,988,065 A | 1/1935 | Wooddell |
| 2,027,087 A | 1/1936 | Buckner |
| 2,027,307 A | 1/1936 | Schacht |
| 2,033,991 A | 3/1936 | Melton |
| 2,035,521 A | 3/1936 | Benner |
| RE20,660 E | 2/1938 | Schacht |
| 2,184,348 A | 12/1939 | Kirchner |
| 2,187,624 A | 1/1940 | Melton |
| 2,194,253 A | 3/1940 | Benner |
| 2,268,663 A | 1/1942 | Kuzmick |

(Continued)

FOREIGN PATENT DOCUMENTS

| | | |
|---|---|---|
| CN | 1351922 | 6/2002 |
| CN | 1494984 | 5/2004 |

(Continued)

OTHER PUBLICATIONS

PCT/US2012/039199; filed May 23, 2012; Chien-Min Sung; International Search Report dated Dec. 18, 2012.

(Continued)

*Primary Examiner* — George Nguyen
(74) *Attorney, Agent, or Firm* — Thorpe North & Western LLP

(57) ABSTRACT

CMP pad dressers having leveled tips and associated methods are provided. In one aspect, for example, a CMP pad dresser can include a matrix layer and a monolayer of a plurality of superabrasive particles embedded in the matrix layer, where each superabrasive particle in the monolayer protrudes from the matrix layer. The difference in the protrusion distance between the highest protruding tip and the next highest protruding tip of the monolayer of superabrasive particles is less than or equal to about 20 microns, and the difference in protrusion distance between the highest 1% of the protruding tips of the monolayer of superabrasive particles are within about 80 microns or less.

8 Claims, 2 Drawing Sheets

(56) References Cited

U.S. PATENT DOCUMENTS

| | | | | |
|---|---|---|---|---|
| 2,281,558 | A | 5/1942 | Cross | |
| 2,307,461 | A * | 1/1943 | Guth | 51/295 |
| 2,318,570 | A | 5/1943 | Carlton | |
| 2,334,572 | A | 11/1943 | Melton | |
| 2,612,348 | A | 9/1952 | Catallo | |
| 2,725,693 | A | 12/1955 | Smith | |
| 2,811,960 | A | 11/1957 | Fessel | |
| 2,867,086 | A | 1/1959 | Haley | |
| 2,876,086 | A | 3/1959 | Raymond | |
| 2,947,608 | A | 8/1960 | Hall | |
| 2,652,951 | A | 9/1960 | Simpson | |
| 2,952,951 | A | 9/1960 | Simpson | |
| 3,067,551 | A | 12/1962 | Maginnis | |
| 3,121,981 | A | 2/1964 | Hurst | |
| 3,127,715 | A | 4/1964 | Christensen | |
| 3,146,560 | A | 9/1964 | Hurst | |
| 3,276,852 | A | 10/1966 | Lemelson | |
| 3,293,012 | A | 12/1966 | Smiley | |
| 3,372,010 | A | 3/1968 | Parsons | |
| 3,377,411 | A | 4/1968 | Charvat | |
| 3,416,560 | A | 12/1968 | Bruno | |
| 3,440,774 | A | 4/1969 | Curn | |
| 3,593,382 | A * | 7/1971 | Miller | 425/78 |
| 3,608,134 | A | 9/1971 | Cook | |
| 3,625,666 | A | 12/1971 | James | |
| 3,630,699 | A | 12/1971 | Catlin | |
| 3,631,638 | A | 1/1972 | Yoshikawa et al. | |
| 3,664,662 | A | 5/1972 | Linz | |
| 3,706,650 | A | 12/1972 | Eisner | |
| 2,078,354 | A | 4/1973 | Webster | |
| 3,743,489 | A | 7/1973 | Wentorf et al. | |
| 3,767,371 | A | 10/1973 | Wentorf et al. | |
| 3,802,130 | A | 4/1974 | Lindenbeck | |
| 3,819,814 | A | 6/1974 | Pope | |
| 3,852,078 | A | 12/1974 | Wakatsuki et al. | |
| 3,894,673 | A | 7/1975 | Lowder et al. | |
| 3,982,358 | A | 9/1976 | Fukuda | |
| 4,018,576 | A | 4/1977 | Lowder et al. | |
| 4,078,906 | A | 3/1978 | Green | |
| 4,149,881 | A | 4/1979 | D'Silva | |
| 4,151,154 | A | 4/1979 | Berger | |
| 4,155,721 | A | 5/1979 | Fletcher | |
| 4,182,628 | A | 1/1980 | D'Silva | |
| 4,188,194 | A | 2/1980 | Gorrigan | |
| 4,201,601 | A | 5/1980 | D'Silva | |
| 4,211,294 | A | 7/1980 | Multakh | |
| 4,211,924 | A | 7/1980 | Muller et al. | |
| 4,224,380 | A | 9/1980 | Bovenkerk et al. | |
| 4,228,214 | A | 10/1980 | Steigelman et al. | |
| 4,229,186 | A | 10/1980 | Wilson | |
| 4,273,561 | A | 6/1981 | Villalobos | |
| 4,287,168 | A | 9/1981 | Wentorf et al. | |
| 4,289,503 | A | 9/1981 | Corrigan | |
| 4,341,532 | A | 7/1982 | Oide | |
| 4,355,489 | A | 10/1982 | Heyer et al. | |
| 4,405,411 | A | 9/1983 | Inoue et al. | |
| 4,481,016 | A | 11/1984 | Campbell et al. | |
| 4,525,179 | A | 6/1985 | Gigl | |
| 4,547,257 | A | 10/1985 | Iizuka et al. | |
| 4,551,195 | A | 11/1985 | Iizuka et al. | |
| 4,565,034 | A | 1/1986 | Sekiya | |
| 4,610,699 | A | 9/1986 | Yazu et al. | |
| 4,617,181 | A | 10/1986 | Yazu et al. | |
| 4,629,373 | A | 12/1986 | Hall | |
| 4,632,817 | A | 12/1986 | Yazu et al. | |
| 4,662,896 | A | 5/1987 | Dennis | |
| 4,669,522 | A | 6/1987 | Griffin | |
| 4,680,199 | A | 7/1987 | Vontell et al. | |
| 4,712,552 | A | 12/1987 | Pangburn | |
| 4,737,162 | A | 4/1988 | Grazen | |
| 4,749,514 | A | 6/1988 | Murakami et al. | |
| 4,770,907 | A | 9/1988 | Kimura | |
| 4,776,861 | A | 10/1988 | Frushour | |
| 4,780,274 | A | 10/1988 | Barr | |
| 4,797,241 | A | 1/1989 | Peterson et al. | |
| 4,828,582 | A | 5/1989 | Frushour | |
| 4,849,602 | A | 7/1989 | Gardner | |
| 4,863,573 | A | 9/1989 | Moore et al. | |
| 4,866,888 | A | 9/1989 | Murai et al. | |
| 4,883,500 | A | 11/1989 | Deakins et al. | |
| 4,908,046 | A | 3/1990 | Wiand | |
| 4,916,869 | A | 4/1990 | Oliver | |
| 4,923,490 | A | 5/1990 | Johnson et al. | |
| 4,925,457 | A | 5/1990 | deKok et al. | |
| 4,927,619 | A | 5/1990 | Tsuji | |
| 4,943,488 | A | 7/1990 | Sung et al. | |
| 4,945,686 | A | 8/1990 | Wiand | |
| 4,949,511 | A | 8/1990 | Endo et al. | |
| 4,954,139 | A | 9/1990 | Cerutti | |
| 4,968,326 | A | 11/1990 | Wiand | |
| 5,000,273 | A | 3/1991 | Horton et al. | |
| 5,011,513 | A | 4/1991 | Zador et al. | |
| 5,022,895 | A | 6/1991 | Wiand | |
| 5,024,680 | A | 6/1991 | Chen et al. | |
| 5,030,276 | A * | 7/1991 | Sung et al. | 75/237 |
| 5,037,451 | A | 8/1991 | Burnand et al. | |
| 5,043,120 | A | 8/1991 | Corrigan | |
| 5,049,165 | A | 9/1991 | Tselesin | |
| 5,092,082 | A | 3/1992 | Padberg | |
| 5,092,910 | A | 3/1992 | deKok et al. | |
| 5,116,568 | A | 5/1992 | Sung | |
| 5,131,924 | A | 7/1992 | Wiand | |
| 5,133,782 | A | 7/1992 | Wiand | |
| 5,137,543 | A | 8/1992 | Heath et al. | |
| 5,151,107 | A | 9/1992 | Cho et al. | |
| 5,164,247 | A | 11/1992 | Solanki et al. | |
| 5,176,155 | A | 1/1993 | Rudolph, Jr. | |
| 5,190,568 | A | 3/1993 | Tselesin | |
| 5,194,070 | A | 3/1993 | Sumiya et al. | |
| 5,194,071 | A | 3/1993 | Corrigan et al. | |
| 5,195,403 | A | 3/1993 | Sani et al. | |
| 5,195,404 | A | 3/1993 | Notter et al. | |
| 5,197,249 | A | 3/1993 | Wiand | |
| 5,203,881 | A | 4/1993 | Wiand | |
| 5,232,320 | A | 8/1993 | Tank et al. | |
| 5,243,790 | A | 9/1993 | Gagne | |
| 5,246,884 | A | 9/1993 | Jaso | |
| 5,247,765 | A | 9/1993 | Quintana | |
| 5,248,317 | A | 9/1993 | Tank | |
| 5,264,011 | A | 11/1993 | Brown et al. | |
| 5,266,236 | A | 11/1993 | Bovenkerk | |
| 5,271,547 | A | 12/1993 | Carlson | |
| 5,273,730 | A | 12/1993 | Yoshida et al. | |
| 5,295,402 | A | 3/1994 | Bovenkerk | |
| 5,314,513 | A | 5/1994 | Miller | |
| 5,328,548 | A | 7/1994 | Tsuji et al. | |
| 5,364,423 | A | 11/1994 | Bigelow et al. | |
| 5,374,293 | A | 12/1994 | Takashita et al. | |
| 5,380,390 | A * | 1/1995 | Tselesin | 156/230 |
| 5,443,032 | A | 8/1995 | Vichr et al. | |
| 5,453,106 | A | 9/1995 | Roberts | |
| 5,454,343 | A | 10/1995 | Eun et al. | |
| 5,458,754 | A | 10/1995 | Sathrum et al. | |
| 5,486,131 | A | 1/1996 | Cesna et al. | |
| 5,492,771 | A * | 2/1996 | Lowder et al. | 428/565 |
| 5,492,774 | A | 2/1996 | Tateno et al. | |
| 5,496,386 | A | 3/1996 | Broberg et al. | |
| 5,500,248 | A | 3/1996 | Iacovangelo et al. | |
| 5,505,272 | A | 4/1996 | Clark | |
| 5,518,443 | A | 5/1996 | Fisher | |
| 5,527,424 | A | 6/1996 | Mullins | |
| 5,536,202 | A | 7/1996 | Appel et al. | |
| 5,547,417 | A | 8/1996 | Breivogel et al. | |
| 5,551,959 | A | 9/1996 | Martin et al. | |
| 5,560,745 | A | 10/1996 | Roberts | |
| 5,560,754 | A | 10/1996 | Johnson et al. | |
| 5,609,286 | A | 3/1997 | Anthon | |
| 5,620,489 | A | 4/1997 | Tselesin | |
| 5,660,894 | A | 8/1997 | Chen et al. | |
| 5,669,943 | A | 9/1997 | Horton et al. | |
| 5,674,572 | A | 10/1997 | Sarin et al. | |
| 5,725,421 | A | 3/1998 | Goers et al. | |
| 5,746,931 | A | 5/1998 | Graebner | |
| RE35,812 | E | 6/1998 | Oliver | |

(56) References Cited

U.S. PATENT DOCUMENTS

| | | | |
|---|---|---|---|
| 5,772,756 A | 6/1998 | Davies et al. | |
| 5,776,214 A | 7/1998 | Wood | |
| 5,779,743 A | 7/1998 | Wood | |
| 5,791,975 A | 8/1998 | Cesna et al. | |
| 5,801,073 A | 9/1998 | Robbins et al. | |
| 5,816,891 A | 10/1998 | Woo | |
| 5,820,450 A | 10/1998 | Calhoun | |
| 5,833,519 A | 11/1998 | Moore | |
| 5,851,138 A | 12/1998 | Hempel, Jr. | |
| 5,855,314 A | 1/1999 | Shiue et al. | |
| 5,868,806 A | 2/1999 | Nishio et al. | |
| 5,885,137 A | 3/1999 | Ploessl | |
| 5,902,173 A | 5/1999 | Tanaka | |
| 5,916,011 A | 6/1999 | Kim | |
| 5,919,084 A | 7/1999 | Powell et al. | |
| 5,921,856 A | 7/1999 | Zimmer | |
| 5,924,917 A | 7/1999 | Benedict et al. | |
| 5,961,373 A | 10/1999 | Lai | |
| 5,975,988 A | 11/1999 | Christianson | |
| 5,976,001 A | 11/1999 | Powell et al. | |
| 5,976,205 A | 11/1999 | Andrews et al. | |
| 5,980,852 A | 11/1999 | Gurns et al. | |
| 5,980,982 A | 11/1999 | Degawa et al. | |
| 5,985,228 A | 11/1999 | Corrigan et al. | |
| 6,001,008 A | 12/1999 | Fujimori et al. | |
| 6,001,174 A | 12/1999 | Fang | |
| 6,024,824 A | 2/2000 | Krech | |
| 6,027,659 A | 2/2000 | Billett | |
| 6,030,595 A | 2/2000 | Sumiya et al. | |
| 6,039,641 A | 3/2000 | Sung | |
| 6,054,183 A | 4/2000 | Zimmer et al. | |
| 6,093,280 A | 7/2000 | Kirchner et al. | |
| 6,106,382 A | 8/2000 | Sakaguchi | |
| 6,123,612 A | 9/2000 | Goers | |
| 6,125,612 A | 10/2000 | Main | |
| 6,159,087 A | 12/2000 | Birang et al. | |
| 6,159,286 A | 12/2000 | Sung | |
| 6,179,886 B1 | 1/2001 | Gordeev et al. | |
| 6,190,240 B1 | 2/2001 | Kinoshita et al. | |
| 6,196,911 B1 | 3/2001 | Preston et al. | |
| 6,200,360 B1 | 3/2001 | Imai et al. | |
| 6,206,942 B1 | 3/2001 | Wood et al. | |
| 6,213,856 B1 | 4/2001 | Cho et al. | |
| 6,217,413 B1 | 4/2001 | Christianson | |
| 6,224,469 B1 | 5/2001 | Ohmori et al. | |
| 6,258,138 B1 | 7/2001 | DeVoe et al. | |
| 6,258,201 B1 | 7/2001 | Krech | |
| 6,258,237 B1 | 7/2001 | Gal-Or et al. | |
| 6,281,129 B1 | 8/2001 | Easter et al. | |
| 6,284,556 B1 | 9/2001 | Wang et al. | |
| 6,286,498 B1 | 9/2001 | Sung | |
| 6,293,854 B1 | 9/2001 | Kimura et al. | |
| 6,299,508 B1 | 10/2001 | Gagliardi et al. | |
| 6,299,521 B1* | 10/2001 | Morimura et al. | 451/533 |
| 6,312,324 B1 | 11/2001 | Mitsui et al. | |
| 6,319,108 B1 | 11/2001 | Adefris et al. | |
| 6,325,709 B1 | 12/2001 | Nanda et al. | |
| 6,346,202 B1 | 2/2002 | Molnar | |
| 6,354,918 B1 | 3/2002 | Togawa et al. | |
| 6,354,929 B1 | 3/2002 | Adefris et al. | |
| 6,368,198 B1 | 4/2002 | Sung et al. | |
| 6,371,838 B1 | 4/2002 | Holzapfel | |
| 6,371,842 B1 | 4/2002 | Romero | |
| 6,372,001 B1* | 4/2002 | Omar et al. | 51/298 |
| 6,394,886 B1 | 5/2002 | Chen et al. | |
| 6,409,580 B1 | 6/2002 | Lougher et al. | |
| 6,416,878 B2 | 7/2002 | An | |
| 6,439,986 B1 | 8/2002 | Myoung et al. | |
| 6,446,740 B2 | 9/2002 | Eyre | |
| 6,458,018 B1 | 10/2002 | Goers et al. | |
| 6,478,831 B2 | 11/2002 | Tselesin | |
| 6,497,853 B1 | 12/2002 | Davies et al. | |
| 6,544,599 B1 | 4/2003 | Brown et al. | |
| 6,551,176 B1 | 4/2003 | Garretson | |
| 6,605,798 B1 | 8/2003 | Cullen | |
| 6,607,423 B1 | 8/2003 | Areayan et al. | |
| 6,616,725 B2 | 9/2003 | Cho et al. | |
| 6,626,167 B2 | 9/2003 | Kim et al. | |
| 6,627,168 B1 | 9/2003 | Ohsubo et al. | |
| 6,629,884 B1 | 10/2003 | Goers | |
| 6,672,943 B2 | 1/2004 | Vogtmann | |
| 6,679,243 B2 | 1/2004 | Sung | |
| 6,692,547 B2* | 2/2004 | Kim | 51/298 |
| 6,694,847 B2 | 2/2004 | Hiroyasu et al. | |
| 6,722,952 B2 | 4/2004 | Goers et al. | |
| 6,749,485 B1 | 6/2004 | James et al. | |
| 6,755,720 B1 | 6/2004 | Ishizaki et al. | |
| 6,769,969 B1 | 8/2004 | Duescher | |
| 6,790,126 B2 | 9/2004 | Wood et al. | |
| 6,818,029 B2 | 11/2004 | Myoung et al. | |
| 6,824,455 B2 | 11/2004 | Osterheld et al. | |
| 6,835,365 B1 | 12/2004 | Davies et al. | |
| 6,837,979 B2 | 1/2005 | Uzho et al. | |
| 6,884,155 B2 | 4/2005 | Sung et al. | |
| 6,899,592 B1 | 5/2005 | Kojima et al. | |
| 6,905,571 B2 | 6/2005 | Sakuma et al. | |
| 6,945,857 B1 | 9/2005 | Doan et al. | |
| 6,979,357 B2 | 12/2005 | Fries et al. | |
| 7,021,995 B2 | 4/2006 | Toge et al. | |
| 7,033,408 B2 | 4/2006 | Fries et al. | |
| 7,044,990 B2 | 5/2006 | Ishizaki et al. | |
| 7,066,795 B2 | 6/2006 | Balagani et al. | |
| 7,067,903 B2 | 6/2006 | Tachibana et al. | |
| 7,124,753 B2* | 10/2006 | Sung | 125/12 |
| 7,150,677 B2 | 12/2006 | Yamashita et al. | |
| 7,198,553 B2* | 4/2007 | Goers | 451/56 |
| 7,201,645 B2 | 4/2007 | Sung | |
| 7,247,577 B2 | 7/2007 | Palmgren et al. | |
| 7,258,708 B2 | 8/2007 | Sung | |
| 7,261,621 B2 | 8/2007 | Moon et al. | |
| 7,323,049 B2* | 1/2008 | Sung | 117/79 |
| 7,368,013 B2 | 5/2008 | Sung | |
| 7,384,436 B2 | 6/2008 | Sung | |
| 7,404,857 B2* | 7/2008 | Sung | 117/79 |
| 7,465,217 B2 | 12/2008 | Kinoshita et al. | |
| 7,494,404 B2* | 2/2009 | Sung | 451/527 |
| 7,507,267 B2 | 3/2009 | Hall et al. | |
| 7,585,366 B2 | 9/2009 | Sung | |
| 7,641,538 B2 | 1/2010 | Goers | |
| 7,651,368 B2 | 1/2010 | Kendall et al. | |
| 7,651,386 B2 | 1/2010 | Sung | |
| 7,658,666 B2 | 2/2010 | Sung | |
| 7,690,971 B2 | 4/2010 | Sung | |
| 7,762,872 B2 | 7/2010 | Sung | |
| 7,791,188 B2 | 9/2010 | Sung | |
| 7,840,305 B2 | 11/2010 | Behr et al. | |
| 7,954,483 B2 | 6/2011 | Kim et al. | |
| 8,104,464 B2 | 1/2012 | Sung | |
| 8,377,158 B2 | 2/2013 | Palmgren et al. | |
| 8,393,934 B2 | 3/2013 | Sung | |
| 8,398,466 B2 | 3/2013 | Sung et al. | |
| 8,545,583 B2* | 10/2013 | Duescher | 51/298 |
| 8,777,699 B2* | 7/2014 | Sung | 451/443 |
| 2001/0003884 A1 | 6/2001 | Wei et al. | |
| 2001/0009844 A1 | 7/2001 | Cho et al. | |
| 2001/0046835 A1* | 11/2001 | Wielonski et al. | 451/533 |
| 2002/0014041 A1 | 2/2002 | Baldonai et al. | |
| 2002/0042200 A1 | 4/2002 | Fawcett | |
| 2002/0127962 A1 | 9/2002 | Cho et al. | |
| 2002/0139680 A1* | 10/2002 | George | 205/110 |
| 2002/0164928 A1 | 11/2002 | Tolles | |
| 2002/0173234 A1* | 11/2002 | Sung et al. | 451/21 |
| 2002/0182401 A1 | 12/2002 | Lawing | |
| 2003/0054746 A1 | 3/2003 | Nussbaumer | |
| 2003/0084894 A1 | 5/2003 | Sung | |
| 2003/0092357 A1 | 5/2003 | Yoon et al. | |
| 2003/0114094 A1 | 6/2003 | Myoung et al. | |
| 2003/0207659 A1 | 11/2003 | Annen et al. | |
| 2004/0009742 A1 | 1/2004 | Lin et al. | |
| 2004/0023610 A1 | 2/2004 | Hu et al. | |
| 2004/0060243 A1 | 4/2004 | Fries et al. | |
| 2004/0079033 A1 | 4/2004 | Long | |
| 2004/0091627 A1 | 5/2004 | Ohara et al. | |
| 2004/0107648 A1 | 6/2004 | Sung | |

(56) References Cited

U.S. PATENT DOCUMENTS

| | | |
|---|---|---|
| 2004/0180617 A1 | 9/2004 | Goers |
| 2004/0203325 A1 | 10/2004 | Donohue |
| 2004/0235406 A1* | 11/2004 | Duescher .................. 451/527 |
| 2004/0238946 A1 | 12/2004 | Tachibana et al. |
| 2005/0032462 A1 | 2/2005 | Gagliardi et al. |
| 2005/0032469 A1 | 2/2005 | Duescher |
| 2005/0060941 A1 | 3/2005 | Provow |
| 2005/0095959 A1 | 5/2005 | Sung |
| 2005/0118939 A1 | 6/2005 | Duescher |
| 2005/0215188 A1 | 9/2005 | Toge et al. |
| 2005/0227590 A1 | 10/2005 | Sung |
| 2005/0260939 A1 | 11/2005 | Andrews et al. |
| 2006/0073774 A1 | 4/2006 | Sung |
| 2006/0079160 A1 | 4/2006 | Balagani et al. |
| 2006/0079162 A1 | 4/2006 | Yamashita et al. |
| 2006/0128288 A1 | 6/2006 | An et al. |
| 2006/0135050 A1 | 6/2006 | Petersen et al. |
| 2006/0143991 A1 | 7/2006 | Sung |
| 2006/0213128 A1* | 9/2006 | Sung .................. 51/307 |
| 2006/0254154 A1 | 11/2006 | Huang et al. |
| 2006/0258276 A1 | 11/2006 | Sung |
| 2007/0051354 A1 | 3/2007 | Sung |
| 2007/0051355 A1 | 3/2007 | Sung |
| 2007/0060026 A1 | 3/2007 | Sung |
| 2007/0066194 A1 | 3/2007 | Wielonski et al. |
| 2007/0093181 A1 | 4/2007 | Lugg et al. |
| 2007/0128994 A1 | 6/2007 | Sung |
| 2007/0155298 A1 | 7/2007 | Sung |
| 2007/0232074 A1 | 10/2007 | Ravi et al. |
| 2007/0249270 A1* | 10/2007 | Sung .................. 451/527 |
| 2007/0254566 A1 | 11/2007 | Sung |
| 2007/0264918 A1 | 11/2007 | Sung |
| 2007/0266639 A1 | 11/2007 | Sung |
| 2007/0295267 A1 | 12/2007 | Sung |
| 2008/0014845 A1 | 1/2008 | Yimaz et al. |
| 2008/0076338 A1 | 3/2008 | Andrews et al. |
| 2008/0096479 A1 | 4/2008 | Sung |
| 2008/0153398 A1 | 6/2008 | Sung |
| 2008/0171503 A1 | 7/2008 | Sung |
| 2008/0271384 A1 | 11/2008 | Puthanangady |
| 2008/0292869 A1 | 11/2008 | Sung |
| 2008/0296756 A1 | 12/2008 | Koch et al. |
| 2009/0068937 A1 | 3/2009 | Sung |
| 2009/0093195 A1 | 4/2009 | Sung |
| 2009/0094902 A1 | 4/2009 | Hou |
| 2009/0123705 A1 | 5/2009 | Sung |
| 2009/0145045 A1 | 6/2009 | Sung |
| 2009/0215363 A1 | 8/2009 | Sung |
| 2009/0283089 A1 | 11/2009 | Sung |
| 2010/0015898 A1 | 1/2010 | An et al. |
| 2010/0022174 A1* | 1/2010 | Chou et al. .................. 451/548 |
| 2010/0139174 A1 | 6/2010 | Sung |
| 2010/0186479 A1 | 7/2010 | Borucki et al. |
| 2010/0203811 A1 | 8/2010 | Philipossian et al. |
| 2010/0221990 A1 | 9/2010 | Sung |
| 2010/0248595 A1 | 9/2010 | Dinh-Ngoc et al. |
| 2010/0248596 A1 | 9/2010 | Sung |
| 2010/0261419 A1 | 10/2010 | Sung |
| 2011/0076925 A1* | 3/2011 | Sung .................. 451/8 |
| 2011/0104989 A1 | 5/2011 | Boutaghou et al. |
| 2011/0192652 A1* | 8/2011 | Shen et al. .................. 175/428 |
| 2011/0212670 A1 | 9/2011 | Sung |
| 2011/0252710 A1 | 10/2011 | Hall et al. |
| 2011/0275288 A1 | 11/2011 | Sung |
| 2011/0293905 A1 | 12/2011 | Sung |
| 2011/0296766 A1 | 12/2011 | Sung |
| 2012/0192499 A1 | 8/2012 | Sung |
| 2012/0241943 A1 | 9/2012 | Sung |
| 2012/0244790 A1* | 9/2012 | Sung .................. 451/443 |
| 2012/0260582 A1 | 10/2012 | Sung |
| 2012/0302146 A1 | 11/2012 | Sung |
| 2013/0225052 A1 | 8/2013 | Song et al. |

FOREIGN PATENT DOCUMENTS

| | | |
|---|---|---|
| EP | 0238434 | 3/1987 |
| EP | 0264674 | 9/1987 |
| EP | 0280657 | 8/1988 |
| EP | 0331344 | 2/1989 |
| EP | 0712941 | 5/1996 |
| EP | 1075898 | 2/2001 |
| GB | 2239011 | 6/1991 |
| GB | 2366804 | 3/2002 |
| JP | 06182184 | 7/1994 |
| JP | 10128654 | 5/1998 |
| JP | 10180618 | 7/1998 |
| JP | 11048122 | 2/1999 |
| JP | 11077536 | 3/1999 |
| JP | 2000167774 | 6/2000 |
| JP | 2000343436 | 12/2000 |
| JP | 2003/071718 | 3/2003 |
| JP | 2007-044823 | 2/2007 |
| JP | 2007/044823 | 2/2007 |
| JP | 2004/025401 | 1/2009 |
| KR | 10/2002/0036138 | 5/2002 |
| KR | 200339181 | 1/2004 |
| KR | 10/2007/0063569 | 6/2007 |
| WO | WO 94/27883 | 12/1994 |
| WO | WO 95/27596 | 10/1995 |
| WO | WO 95/31006 | 11/1995 |
| WO | WO 96/06732 | 3/1996 |
| WO | WO 98/10897 | 3/1998 |
| WO | WO 98/51448 | 3/1998 |
| WO | WO 98/45091 | 10/1998 |
| WO | WO 98/45092 | 10/1998 |
| WO | WO 02/31078 | 4/2002 |
| WO | WO 2004/094106 | 11/2004 |
| WO | WO 2006/039413 | 4/2006 |
| WO | WO2006/124792 | 11/2006 |
| WO | WO 2007/032946 | 3/2007 |
| WO | WO2008/063599 | 5/2008 |
| WO | WO 2009/043058 | 4/2009 |
| WO | WO 2009/064677 | 5/2009 |
| WO | WO 2012/040374 A2 | 3/2012 |

OTHER PUBLICATIONS

U.S. Appl. No. 13/362,917, filed Jan. 13, 2012; Chien-Min Sung; office action dated Dec. 31, 2012.

U.S. Appl. No. 12/168,110, filed Jul. 5, 2008; Chien-Min Sung; notice of allowance dated Jan. 18, 2013.

U.S. Appl. No. 13/239,198, filed Sep. 21, 2011; Chien-Min Sung; office action dated Jul. 23, 2013.

PCT/US2013/042538; filed May 23, 2013; Chien-Min Sung; international search report dated Aug. 27, 2013.

U.S. Appl. No. 12/726,786, filed Mar. 18, 2010; Chien-Min Sung; notice of allowance dated Sep. 4, 2013.

U.S. Appl. No. 12/255,823, filed Oct. 22, 2008; Chien-Min Sung; notice of allowance dated Dec. 26, 2012.

U.S. Appl. No. 12/726,786, filed Mar. 18, 2010; Chien-Min Sung; office action dated Mar. 19, 2013.

U.S. Appl. No. 13/362,917, filed Jan. 31, 2012; Chien-Min Sung; office action dated Apr. 10, 2013.

U.S. Appl. No. 13/407,634, filed Feb. 28, 2012; Chien-Min Sung; office action dated Jun. 13, 2014.

U.S. Appl. No. 13/239, 189, filed Sep. 21, 2011; Chien-Min Sung; office action dated Dec. 21, 2012.

U.S. Appl. No. 12/059,422, filed Mar. 31, 2008; Chien-Min Sung; office action dated Jan. 24, 2013.

U.S. Appl. No. 13/153,176, filed Jun. 3, 2011; Chien-Min Sung; office action dated Dec. 6, 2013.

U.S. Appl. No. 12/715,583, filed Mar. 2, 2010; Chien-Min Sung; notice of allowance dated Dec. 7, 2012.

U.S. Appl. No. 13/113,779, filed May 23, 2011; Chien-Min Sung; office action dated Nov. 12, 2013.

U.S. Appl. No. 13/021,350, filed Feb. 4, 2011; Chien-Min Sung; office action dated Mar. 20, 2013.

U.S. Appl. No. 13/239,189, filed Sep. 21, 2011; Chien-Min Sung; notice of allowance dated May 3, 2013.

(56) References Cited

OTHER PUBLICATIONS

U.S. Appl. No. 12/267,172, filed Nov. 7, 2008; Chien-Min Sung; notice of allowance dated Jan. 7, 2013.
U.S. Appl. No. 13/239,189, filed Sep. 21, 2011; Chien-Min Sung; notice of allowance dated Mar. 4, 2014.
U.S. Appl. No. 13/644,790, filed Oct. 4, 2012; Chien-Min Sung; office action dated Jun. 17, 2014.
U.S. Appl. No. 13/416,201, filed Mar. 9, 2012; Chien-Min Sung; office action dated Jun. 18, 2014.
U.S. Appl. No. 13/153,176, filed Jun. 3, 2011; Chien-Min Sung; office action dated Jul. 1, 2014.
U.S. Appl. No. 13/113,779, filed May 23, 2011; Chien-Min Sung office action dated Jul. 2, 2014.
U.S. Appl. No. 13/794,164, filed Mar. 11, 2013; Chien-Min Sung; office action dated Jul. 16, 2014.
Colmonoy Technical Data Sheet; No. DSP-A; 1993.
Endecott's Specifications; 2004.
Kennametal Specification for DMHPM002 Hot Press Matrix N-50 Dec. 6, 2001.
Material Safety Data Sheet (MSDS), Wall Colmonoy Corporation; prepared Jul. 20, 1989.
Material Safety Data Sheet (MSDS); Kennametal; issued Jun. 11, 2004.
Sung et al.; The Eastern Wind of Diamond Synthesis; New Diamond and Frontier Carpon Technology; 2003; pp. 47-61; vol. 13, No. 1.
Sung et al; Mechanism of the Solvent-Assisted Graphite to Diamond Transition Under High Pressure: Implications for the Selection of Catalysts, High Temperatures-High Pressure; 1995/1996; pp. 523-546; vol. 27/28.
Syndite, CTM302; Announcement, Elementsix Advancing Diamond; Jan. 14, 2003; http://www.e6.com/en/resourches/announcementsheets/CTM302.pdf; as accessed on Dec. 16, 2008.
Sung et al.; The Eastern Wind of Diamond Symthesis; New Diamond and Frontier Carpon Technology; 2003; pp. 47-61; vol. 13, No. 1.
Syndite, Elementsix Advancing Diamond; 2 pages; Jan. 14, 2003.
U.S. Appl. No. 08/832,852, filed Apr. 4, 1997; Chien-Min Sung.
U.S. Appl. No. 09/447,620, filed Nov. 22, 1999; Chien-Min Sung.
U.S. Appl. No. 11/512,755, filed Aug. 29, 2006; Chien-Min Sung.
U.S. Appl. No. 13/239,198, filed Sep. 21, 2011; Chien-Min Sung.
U.S. Appl. No. 13/416,201, filed Mar. 9, 2012; Chien-Min Sung.
U.S. Appl. No. 13/479,148, filed May 23, 2012; Chien-Min Sung.
Yasinaga et al; Advances in Abrasive Technology, III; Soc. of Grinding Engineers (SGE) in Japan; 2000.
PCT Application PCT/US2011/052627; filed Sep. 21, 2011; Chien-Min Sung; International Search Report mailed May 11, 2012.
U.S. Appl. No. 13/362,917, filed Jan. 31, 2012; Chien-Min Sung; office action dated Jun. 14, 2012.
U.S. Appl. No. 12/168,110, filed Jul. 5, 2008; Chien-Min Sung; office action dated May 14, 2012.
U.S. Appl. No. 12/059,422, filed Mar. 30, 2008; Chien-Min Sung; office action dated Aug. 22, 2012.
U.S. Appl. No. 12/255,823, filed Oct. 21, 2008; Chien-Min Sung; notice of allowance dated Sep. 21, 2012.
U.S. Appl. No. 12/168,110, filed Jul. 5, 2008; Chien-Min Sung; notice of allowance dated Sep. 28, 2012.
PCT Application PCT/US2007/024165; filed Nov. 16, 2007; Chien-Min Sung; Internaitonal Search Report mailed May 23, 2011.
PCT Application PCT/US2011/052626; filed Sep. 21, 2011; Chien-Min Sung; International Search Report mailed May 2, 2012.
U.S. Appl. No. 12/255,823, filed Oct. 22, 2005; Chien-Min Sung; office action issued Mar. 7, 2012.
U.S. Appl. No. 12/267,172, filed Nov. 7, 2008; Chien-Min Sung; office action issued Jan. 3, 2012.
U.S. Appl. No. 12/267,172, filed Jan. 31, 2012; Chien-Min Sung; office action issued Jul. 9, 2012.
U.S. Appl. No. 12/715,583, filed Mar. 2, 2010; Chien-Min Sung; office action issued Mar. 21, 2012.
U.S. Appl. No. 12/715,583, filed Mar. 2, 2010; Chien-Min Sung; office action issued Aug. 9, 2012.
U.S. Appl. No. 12/715,583, filed Mar. 2, 2010; Chien-Min Sung; office action issued Oct. 25, 2011.
U.S. Appl. No. 12/328,338, filed Dec. 4, 2008; Chien-Min Sung; office action issued May 10, 2011.
U.S. Appl. No. 13/021,350, filed Feb. 4, 2011; Chien-Min Sung; office action issued Aug. 31, 2011.
U.S. Appl. No. 13/021,350, filed Feb. 4, 2011; Chien-Min Sung; office action issued Feb. 7, 2012.
U.S. Appl. No. 13/113,779, filed May 23, 2011; Chien-Min Sung; office action dated Oct. 9, 2014.
U.S. Appl. No. 13/153,176, filed Jun. 3, 2011; Chien-Min Sung; office action dated Oct. 10, 2014.
U.S. Appl. No. 13/407,634, filed Feb. 28, 2012; Chien-Min Sung; office action dated Oct. 29, 2014.
U.S. Appl. No. 13/802,112, filed Mar. 13, 2013; Chien-Min Sung; office action dated Nov. 6, 2014.
U.S. Appl. No. 13/644,790, filed Oct. 4, 2012; Chien-Min Sung; office action dated Dec. 24, 2014.

* cited by examiner

_US 8,974,270 B2_

CMP PAD DRESSER HAVING LEVELED TIPS AND ASSOCIATED METHODS

PRIORITY DATA

This application claims the benefit of U.S. Provisional Patent Application Ser. No. 61/489,074, filed on May 23, 2011, which is incorporated herein by reference in its entirety.

BACKGROUND OF THE INVENTION

The semiconductor industry currently spends in excess of one billion U.S. dollars each year manufacturing silicon wafers that must exhibit very flat and smooth surfaces. Known techniques to manufacture smooth and even-surfaced silicon wafers are plentiful. The most common of these involves the process known as Chemical Mechanical Polishing (CMP) which includes the use of a polishing pad in combination with an abrasive slurry. Of central importance in all CMP processes is the attainment of high performance levels in aspects such as uniformity of polished wafer, smoothness of the IC circuitry, removal rate for productivity, longevity of consumables for CMP economics, etc.

SUMMARY OF THE INVENTION

The present disclosure provides CMP pad dressers and associated methods thereof. In one aspect, for example, a CMP pad dresser can include a matrix layer and a monolayer of a plurality of superabrasive particles embedded in the matrix layer, where each superabrasive particle in the monolayer protrudes from the matrix layer. The difference in the protrusion distance between the highest protruding tip and the next highest protruding tip of the monolayer of superabrasive particles can be less than or equal to about 20 microns, and the difference in protrusion distance between the highest 1% of the protruding tips of the monolayer of superabrasive particles are within about 80 microns or less. In one specific aspect, a rigid support is coupled to the matrix layer.

In another aspect, the difference in protrusion distance between the highest protruding tip and the next highest protruding tip of the monolayer of superabrasive particles is less than or equal to about 15 microns. In yet another aspect, the difference in protrusion distance between the highest protruding tip and the next highest protruding tip of the monolayer of superabrasive particles is less than or equal to about 10 microns. In a further aspect, the difference in protrusion distance between the highest 10 protruding tips of the monolayer of superabrasive particles are within about 30 microns or less. In another aspect, the difference in protrusion distance between the highest 100 protruding tips of the monolayer of superabrasive particles are within about 50 microns or less. In yet another aspect, the difference in protrusion distance between the highest 1% of the protruding tips of the first monolayer of superabrasive particles are within about 50 microns or less. In another aspect, the difference in protrusion distance between the highest protruding tip and the second highest protruding tip is less than or equal to about 10 microns. In yet another aspect, the difference in protrusion distance between the highest protruding tip and the $10^{th}$ highest protruding tip is less than or equal to about 20 microns. In a further aspect, the difference in protrusion distance between the highest protruding tip and the $100^{th}$ highest protruding tip is less than or equal to about 40 microns. In another aspect, the highest protruding tip protrudes from the matrix layer to a height greater than or equal to about 50 microns.

In another aspect, a CMP pad dresser is provided. Such a dresser can include a first monolayer of superabrasive particles disposed on one side of a metal support layer and a second monolayer of superabrasive particles disposed on the metal support layer on an opposite side from the first monolayer. The superabrasive particles of the second monolayer are positioned to have substantially the same distribution as the superabrasive particles of the first monolayer, and a rigid support is coupled to the second monolayer of superabrasive particles opposite the first monolayer.

In yet another aspect, a method of making a CMP pad dresser includes disposing a first monolayer of superabrasive particles on a metal support layer and disposing a second monolayer of superabrasive particles on the metal support layer on a side opposite the first monolayer. The superabrasive particles of the second monolayer are positioned to have substantially the same distribution as the superabrasive particles of the first monolayer. The method further includes bonding the first monolayer of superabrasive particles and the second monolayer of superabrasive particles to the metal support layer such that symmetrical forces due to the substantially similar distribution between the first monolayer and the second monolayer precludes substantial warping of the metal support layer. In one aspect, the method can further include coupling the second monolayer of superabrasive particles to a rigid support.

In one aspect, the bonding of at least one of the first monolayer and the second monolayer is by brazing with a braze material. In another aspect, the bonding of at least one of the first monolayer and the second monolayer is under heat and pressure. In one specific aspect, the heat and pressure bonds at least one of the first monolayer and the second monolayer directly to the metal support layer. In another specific aspect, the bonding of at least one of the first monolayer and the second monolayer further includes disposing a sintering compound on the metal support layer in contact with at least one of the first monolayer and the second monolayer and sintering the sintering compound to bond the at least one of the first monolayer and the second monolayer to the metal support layer. In one specific aspect, the method further includes infiltrating the sintering compound with a braze material during bonding.

In yet another aspect, a method of minimizing warpage of a CMP pad dresser during manufacture is provided. Such a method can include substantially equalizing warping forces on opposing sides of a metal support layer during bonding of a plurality of superabrasive particles thereto, wherein warpage of the support layer is minimized during bonding due to the equalized forces on opposing sides. In one aspect, substantially equalizing forces includes arranging the plurality of superabrasive particles on opposing sides of the support layer such that the plurality of superabrasive particles has substantially the same distribution on either side of the support layer to substantially equalize warping forces during bonding.

In a further aspect, a CMP pad dresser is provided. Such a dresser can include a plurality of superabrasive particles arranged as a working surface, wherein the difference in protrusion distance between the highest protruding tip and the second highest protruding tip is less than or equal to about 10 microns, the difference in protrusion distance between the highest protruding tip and the $10^{th}$ highest protruding tip is less than or equal to about 20 microns, the difference in protrusion distance between the highest protruding tip and the $100^{th}$ highest protruding tip is less than or equal to about 40 microns, and the highest protruding tip has a protrusion distance of greater than or equal to about 50 microns.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

Figure 1:
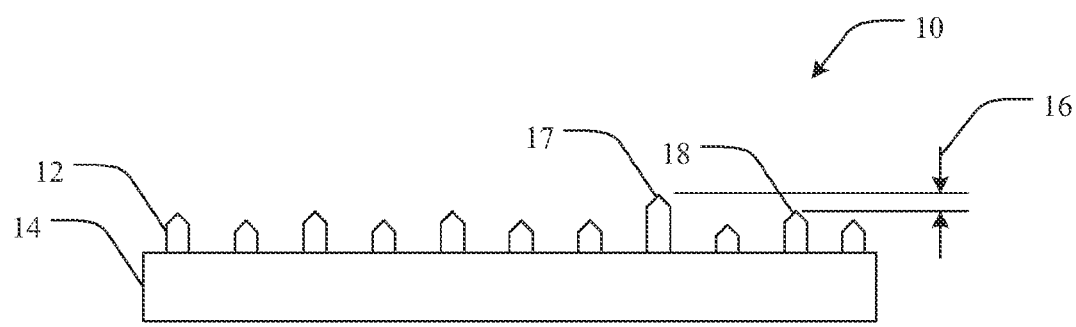
FIG. 1 is a schematic side view of a CMP pad dresser in accordance with an embodiment of the present invention.

It will be understood that the above figures are merely for illustrative purposes in furthering an understanding of the invention. Further, the figures are not drawn to scale, thus dimensions, particle sizes, and other aspects may, and generally are, exaggerated to make illustrations thereof clearer. Therefore, departure can be made from the specific dimensions and aspects shown in the figures in order to produce the heat spreaders of the present invention.

DETAILED DESCRIPTION

Before the present invention is disclosed and described, it is to be understood that this invention is not limited to the particular structures, method steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles and reference to "the layer" includes reference to one or more of such layers.

DEFINITIONS

In describing and claiming the present invention, the following terminology will be used in accordance with the definitions set forth below.

As used herein, the terms "conditioner" and "dresser" can be used interchangeably, and refer to a tool used to condition or dress a pad, such as a CMP pad.

As used herein, "dressing segment" refers to a dressing or conditioning element of a CMP pad dresser. Dressing segments are utilized in the present invention to carry superabrasive particles having leveled tips. Thus superabrasive particles are introduced into a CMP pad dresser by the incorporation of multiple dressing segments. It should be noted that a variety of techniques of attaching the dressing segments to the substrates, and a variety of techniques of attaching the superabrasive particles to the dressing segments, are discussed herein. It is to be understood that all of these various attachment mechanisms can be used interchangeably herein: that is, if a method of attaching a dressing segment to a substrate is discussed herein, the method of attachment discussed can also be used to attach a superabrasive particles to a dressing segment. For any particular CMP pad dresser being discussed, however, it is understood that attachment methods of the superabrasive particles to the dressing segments can differ from, or can be the same as, the method used to attach the dressing segments to the pad conditioner substrate.

As used herein, "superabrasive" may be used to refer to any crystalline, or polycrystalline material, or mixture of such materials which has a Mohr's hardness of about 8 or greater. In some aspects, the Mohr's hardness may be about 9.5 or greater. Such materials include but are not limited to diamond, polycrystalline diamond (PCD), cubic boron nitride (cBN), polycrystalline cubic boron nitride (PcBN), corundum and sapphire, as well as other superabrasive materials known to those skilled in the art. Superabrasive materials may be incorporated into the present invention in a variety of forms including particles, grits, films, layers, pieces, segments, etc. In some cases, the superabrasive materials of the present invention are in the form of polycrystalline superabrasive materials, such as PCD and PcBN materials.

As used herein, "organic material" refers to a semisolid or solid complex or mix of organic compounds. "Organic material layer" and "organic matrix" may be used interchangeably, and refer to a layer or mass of a semisolid or solid complex or mix of organic compounds, including resins, polymers, gums, etc. The organic material can be a polymer or copolymer formed from the polymerization of one or more monomers. In some cases, such organic material can be adhesive.

As used herein, the process of "brazing" is intended to refer to the creation of chemical bonds between the carbon atoms of the superabrasive particles/materials and the braze material. Further, "chemical bond" means a covalent bond, such as a carbide or boride bond, rather than mechanical or weaker inter-atom attractive forces. Thus, when "brazing" is used in connection with superabrasive particles a true chemical bond is being formed. However, when "brazing" is used in connection with metal to metal bonding the term is used in the more traditional sense of a metallurgical bond. Therefore, brazing of a superabrasive segment to a tool body does not necessarily require the presence of a carbide former.

As used herein, "particle" is as used herein in connection with diamond particles, and refers to a particulate form of diamond. Such particles may take a variety of shapes, including round, oblong, square, euhedral, etc., can be either single crystal or polycrystalline, and can have a number of mesh sizes. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, "sharp portion" means any narrow portion to which a crystal or particle may come, including but not limited to corners, apexes, ridges, edges, obelisks, and other protrusions. In some cases, corners and/or apexes are formed at the convergence of more than two faces of the particle or crystal, or other body, disposed in intersecting planes. In other aspects, edges and/or ridges may be formed at the convergence of two or at least two faces of the particle or crystal, or other body, disposed in intersecting planes. In some aspects, "sharp portion" can include a portion that is broken, chipped, cracked, jagged, and the like. In some aspects, degrees of sharpness can be correlated with the geometric angle formed by the particle, crystal, or other body, at the location in question. In some aspects, an angle of 90 degrees or less can be considered sharp. In other aspects, an angle of 60 degrees or less can be considered sharp. In yet other aspects, and angle of 45 degrees or less, or 30 degrees or less can be considered to be sharp.

As used herein, "peripherally located," "peripheral location" and the like, mean any particle of a dresser that is located in an area that originates at the leading edge or outer rim of a dresser and extends inwardly towards the center for up to about 90% of the radius of the dresser. In some aspects, the area may extend inwardly from about 20% to 90% of the radius. In other aspects, the area may extend in to about 50% of the radius. In yet another aspect, the area may extend in to about 33% of the radius of a dresser (i.e. 66% away from the center).

As used herein, "working end" refers to an end of a particle which is oriented towards the CMP pad and during a dressing operation makes contact with the pad. Most often the working end of a particle will be distal from a substrate to which the particle is attached.

As used herein, "attitude" means the position or arrangement of a superabrasive particle in relation to a defined surface, such as a substrate to which it is attached, or a CMP pad to which it is to be applied during a work operation. For example, a superabrasive particle can have an attitude that provides a specific portion of the particle in orientation toward a CMP pad.

As used herein, "sintering" refers to the joining of two or more individual particles to form a continuous solid mass. The process of sintering involves the consolidation of particles to at least partially eliminate voids between particles.

The term "metallic" refers to both metals and metalloids. Metals include those compounds typically considered metals found within the transition metals, alkali and alkali earth metals. Examples of metals are Ag, Au, Cu, Al, and Fe. Metalloids include specifically Si, B, Ge, Sb, As, and Te. Metallic materials also include alloys or mixtures that include metallic materials. Such alloys or mixtures may further include additional additives. In the present invention, carbide formers and carbon wetting agents may be included as alloys or mixtures, but are not anticipated to be the only metallic component. Examples of such carbide formers are Sc, Y, Ti, Zr, Hf, V, Nb, Cr, Mo, Mn, Ta, W, and Tc. Examples of carbon wetting agents are Co, Ni, Mn, and Cr.

As used herein, "infiltrating" refers to a situation where a material is heated to its melting point and then flows as a liquid through the interstitial voids between particles.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

The Invention

The present disclosure generally provides CMP pad dressers and associated methods that can be utilized in conditioning (e.g., smoothing, polishing, dressing) a CMP pad. Pad conditioners of the present invention can be advantageously utilized, for example, in dressing CMP pads that are used in polishing, finishing or otherwise affecting semiconductor materials. Specifically, the present disclosure concerns CMP pad dressers having superabrasive particles with substantially leveled tips. Traditional CMP pad dresser manufacturing methods, even many of those describing techniques for leveling superabrasive particle tips prior to fixation, generally contain significant variation in tip height across the surface of the dresser. Often, the superabrasive particles are affixed to the CMP pad dresser support in a manner that disrupts any leveling that has occurred. For example, fixation techniques that utilize high heat and/or pressure can cause warping of the dresser support as the dresser cools. Thus, unless steps are taken to avoid such warpage, superabrasive particles are not maintained in their leveled state following cooling of the dresser. This can be particularly problematic with brazing techniques.

Accordingly, minimizing the warpage of the metal support layer can maintain a greater degree of leveling of superabrasive particle tips in the finished tool. When heat and/or pressure are used to make a superabrasive tool, warpage of the metal support layer can cause great variations in tip height level, even for those particles that were leveled prior to heating and/or applying pressure. By distributing the warpage forces equally or substantially equally on both sides of the metal support layer through the arrangement of the superabrasive particles, these forces effectively cancel each other with respect to the degree of warping occurring in the metal support layer, thus also minimizing the relative height movement of the superabrasive particles relative to one another.

The present CMP pad dressers include a layer of superabrasive particles having substantially leveled tips across the working surface of the finished CMP pad dresser. A variety of techniques can be utilized to maintain tip leveling, and any such technique is considered to be within the present scope. A few non-limiting examples of such techniques are described below.

In one aspect, as is shown in FIG. 1, a CMP pad dresser 10 includes a monolayer of a plurality of superabrasive particles 12 embedded in a matrix layer 14, such that each superabrasive particle in the monolayer protrudes from the matrix layer. The difference in protrusion distance 16 between the highest protruding tip 17 and the next highest protruding tip 18 of the monolayer of superabrasive particles is less than or equal to about 20 microns. In some aspects, the protrusion difference may be less than or equal to about 50 microns. Additionally, the difference in protrusion distance between the highest 1% of the protruding tips of the first monolayer of superabrasive particles are within about 80 microns or less. In other words, for the 1% of the plurality of superabrasive particles that have the highest protruding tips, the variance in protrusion distance for that 1% is less than or equal to about 80 microns. Thus, the two highest protruding superabrasive particle tips protrude to within about 20 microns or less of each other, and in addition, the highest protruding 1% of superabrasive particle tips protrude to within about 80 microns or less of each other. In another aspect, the difference in protrusion distance between the highest protruding tip and the next highest protruding tip of the monolayer of superabrasive particles is less than or equal to about 15 microns. In yet another aspect, the difference in protrusion distance between the highest protruding tip and the next highest protruding tip of the monolayer of superabrasive particles is less than or equal to about 10 microns. In a further aspect, the difference in protrusion distance between the highest 1% of the protruding tips of the first monolayer of superabrasive particles are within about 70 microns or less. In yet another aspect, the difference in protrusion distance between the highest 1% of the protruding tips of the first monolayer of superabrasive particles are within about 50 microns or less. In another aspect, and in addition to the protrusion variance of the highest two protruding tips, the difference in protrusion distance between the highest 10 protruding tips of the monolayer of superabrasive particles are within about 30 microns or less. In yet another aspect, the difference in protrusion distance between the highest 100 protruding tips of the monolayer of superabrasive particles are within about 50 microns or less. Additionally, in one aspect, the rigid support can be coupled to the matrix layer (not shown).

In another aspect, the difference in protrusion distance the difference in protrusion distance between the highest protruding tip and the second highest protruding tip is less than or equal to about 10 microns. In yet another aspect, the difference in protrusion distance between the highest protruding tip and the $10^{th}$ highest protruding tip is less than or equal to about 20 microns. In a further aspect, the difference in protrusion distance between the highest protruding tip and the $100^{th}$ highest protruding tip is less than or equal to about 40 microns. In yet a further aspect, the highest protruding tip protrudes from the matrix layer to a height greater than or equal to about 50 microns. In another aspect, the highest protruding tip has a protrusion distance of greater than or equal to about 50 microns.

It is noted that the recited protrusion distances can include a distribution across the entire monolayer surface or a discrete area or segment of the monolayer. For example, the highest 1% of protruding tips can be located around the periphery of the monolayer. In another example, discrete regions of leveled superabrasive particle tips can be located within a larger area of superabrasive particles having a lower protrusion distance than the leveled portion. It is also contemplated that the monolayer can include multiple regions or segments of superabrasive particles that are leveled as described, within a larger area of superabrasive particles having a lower protrusion distance.

Various methods can be utilized to measure superabrasive particle tip height to determine the difference in protrusion distance between tips. As such, any method for making such a determination is considered to be within the present scope. It should be noted that for the purposes of the present disclosure, the term "protrusion" refers to the height of a particle relative to some reference point. Techniques for such measurements can include direct measurements of the tip heights relative to a reference point such as, for example, the highest particle tip, a surface of a rigid support, the bottom surface of the matrix, etc. Measurements of particle height from the surface of the matrix material can be problematic, however, due to the irregular nature of such materials due to wicking around the superabrasive particles. In those cases whereby the matrix material is uniform, such a surface may be used to determine particle height. Additionally, a relative protrusion or height difference between two particles would be the difference in the heights between these particles measured from a common reference point. Furthermore, in some cases the superabrasive particles may lie along a slope, curvature, or some other arrangement that is not parallel to the metal support layer. In these cases, the protrusion height would be normalized against the slope, curvature, or other arrangement so that the relative protrusion height difference between particles can be measured in the absence of the slope, curvature, etc. It should be noted that superabrasive particle tip height leveling can, in some cases, be independent from the positioning or patterning of the superabrasive particles across the surface of the dresser.

One example of a direct measurement technique can include an optical scanning process to evaluate superabrasive particle tip positions. In one such process, an optical scanner can scan the surface of the CMP pad dresser to determine the height of the superabrasive particle tips relative to a fixed point. For example, the scanner can scan downward in space toward the dresser until the highest tip is located. The highest tip can then be set to the reference point, and the scanner can continue scanning in a direction toward the dresser measuring the distance from the reference point to each superabrasive particle tip across the surface of the dresser. Accordingly, the difference in protrusion distance between all of the superabrasive particles across the dresser can be directly measured.

Furthermore, measurement techniques can also include indirect measurements, such as, for example, applying the diamond monolayer to a deformable substrate that deforms relative to the protrusion distance of the particle tips. The diamond monolayer can be pressed into the deformable substrate and/or moved across the deformable substrate to form a scratch pattern therein. Tip height can thus be extrapolated from such indirect measurements.

A variety of materials are contemplated for use as superabrasive particles. Any superabrasive known that can be utilized in a CMP pad dresser should be considered to be within the present scope. Non-limiting examples of such materials include diamond materials, nitride materials, ceramics, and the like. In one aspect, the superabrasive particles include diamond materials. Such diamond materials can include natural or synthetic diamond, single crystal, polycrystalline, and the like. In another aspect, the superabrasive particles include cubic boron nitride materials. Additionally, various diamond particles sizes can be used, including mesh sizes such as 10/20, 30/40, 80/90, 90/100, 100/120, 120/140, 140/170, 170/200, 200/230, 230/270, 270/325, and 325/400.

Additionally, the plurality the superabrasive particles can be oriented so as to affect dressing performance of a CMP pad. Orienting the superabrasive particles in a specific attitude in relation to the CMP pad to be dressed creates different asperities in the pad surface, thus altering the performance of the CMP pad. Different asperities retain slurry in different manners and thus polish a workpiece differently according to asperity depth, width, density, etc. The superabrasive particles of a CMP pad dresser can be oriented according to the desired polishing characteristics of the CMP pad. For example, if the superabrasive particles predominantly have an apex oriented towards the CMP pad, the asperities of the pad will be narrow and deep. The advantages of narrow and deep asperities are that the pad can better retain the polishing slurry, and thus the polishing rate of the wafer increases. However, the increased polishing rate may also increase the wear rate of the superabrasive particles. As such, wear rate may vary depending on the attitude of the superabrasive particles, and therefore, the orientation of each superabrasive particle may be considered when designing a device with desired performance characteristics. Generally speaking, superabrasive particle attitudes that provide higher dressing rates (i.e. deeper penetration into a pad) also wear particles out at a higher rate.

In contrast, if the superabrasive particles are oriented with a face towards the pad, the resulting asperities may polish at a lower rate. The face of the particle is generally thought to be more durable, but does not typically cut deep and narrow asperities in the pad, but rather asperities that are shallow and broad. Therefore the face portion of a particle will dress a CMP pad at a reduced rate compared to the apex portion of a particle, but the superabrasive particle will wear at a much lower rate.

The edge portions of a superabrasive particle have dressing and wear characteristics that are between those of the face and apex portions. It has been thought that if the edge portion is utilized to dress a CMP pad, the asperities are not as deep or narrow as those dressed with an apex portion, but may provide asperities having desirable intermediate characteristics. Further, the edge portion of the particle does not wear at such a high rate as that of an apex.

In one aspect, the plurality of superabrasive particles are substantially all configured in an attitude having either an apex portion oriented toward a pad to be dressed. In another aspect, the plurality of superabrasive particles are substantially all configured in an attitude having either an edge portion oriented toward a pad to be dressed. In yet another aspect, the plurality of superabrasive particles can be configured in an attitude having a sharp portion oriented towards a pad to be dressed.

A CMP pad dresser having such substantially leveled tip arrangements can have a low scratch rate because superabrasive particles are less likely to pull out of the matrix layer due to their more uniform protrusion distribution compared to traditional dressers. Additionally, the more uniform protrusion distributions of such a dressers allows the conditioning of CMP pads in such a manner as to facilitate good polishing rates while at the same time extending the effective working life of the dresser. These benefits can be affected by, for example, uniform asperity spacing and size distribution in the CMP pad.

In one aspect of the present disclosure, superabrasive tip leveling can be accomplished by manufacturing the CMP pad dresser in such a way that the effects of warpage are minimized. For example, in one aspect a CMP pad dresser can be made in at least a two stage process, where the first stage is performed in a manner that minimizes perturbations of the leveled tips in a process that would normally significantly move the superabrasive tips out of a leveled arrangement, such as, for example, by brazing. The second stage of the process can further enhance the leveling of superabrasive particle tips across the CMP pad dresser.

Various exemplary configurations of CMP pad dressers having substantially leveled tips are contemplated. In one aspect, for example, a CMP pad dresser can include a first monolayer of superabrasive particles disposed on one side of a metal support layer and a second monolayer of superabrasive particles disposed on the metal support layer on an opposite side from the first monolayer. The superabrasive particles of the second monolayer are positioned to have substantially the same distribution as the superabrasive particles of the first monolayer. A rigid support is coupled to the second monolayer of superabrasive particles opposite the first monolayer to provide support to the dresser.

Figure 2:
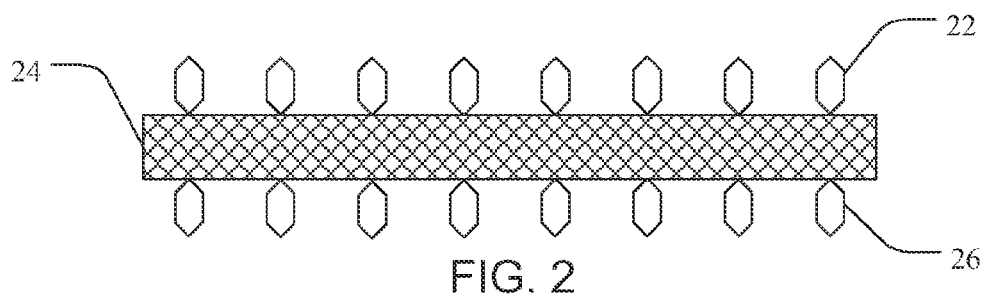
FIG. 2 is a schematic side view of a CMP pad dresser in accordance with an embodiment of the present invention.

As is shown in FIG. 2, a first monolayer of superabrasive particles 22 is arranged on a surface of a metal support layer 24. A second monolayer of superabrasive particles 26 is arranged on the metal support layer 24 on a side that is opposite to the first monolayer. As is discussed further below, in some cases the first and second monolayers of superabrasive particles can be arranged such that corresponding superabrasive particles across the metal support layer are in substantial alignment, as is shown in FIG. 2. In other cases, the superabrasive particles of the first and second monolayers can be arranged in a substantially similar distribution, but may or may not be substantially aligned with one another across the metal support layer.

The metal support layer can be any material capable of supporting the diamond monolayer during tool formation. Such materials can include, without limitation, metal materials, metal alloy materials, braze alloy materials, ceramic materials, composites, and the like.

In one aspect, the superabrasive particles can be arranged into a predetermined pattern. Such a pattern can be a uniformly distributed pattern or a non-uniformly distributed pattern. Additionally, a variety of techniques are contemplated to facilitate the arrangement of superabrasive particles into a predetermined pattern. Predetermined is understood to mean a non-random pattern that has been determined prior to arranging the superabrasive particles. In one aspect, a predetermined pattern can also apply to a predetermined spacing between particles. Non-limiting examples of such techniques include arrangement by a template, arrangement using spots of adhesives, arrangement on a first substrate followed by a pattern specific transfer from the first substrate to the metal support layer, and the like, including combinations thereof. The superabrasive particles from either of the monolayers can be temporarily held in position in the predetermined pattern using a variety of techniques, including, without limitation, adhesives, dimpled locations on the metal support matrix, a supporting compound such as, for example, a wax, and the like, including combinations thereof. In one specific aspect, the superabrasive particles can be temporarily coupled to the metal support layer using an adhesive that then volatilizes away and is eliminated during construction of the dresser.

In one aspect, the predetermined pattern can be a uniformly distributed grid. In another aspect, the predetermined pattern can be an annular configuration having a central region devoid of superabrasive particles. In one specific aspect, the annular configuration can include an annular ring. In another specific aspect, the annular configuration can include a portion of an annular ring. In yet another aspect, an annular configuration can include one or more concentric annular rings nested inside one another. In other aspects, the monolayer distribution can be discrete radial regions, spiral regions, and the like.

The disposition of a monolayer of superabrasive particles on each side of the metal layer thus moderates the thermal shrinkage from the brazing temperature that would otherwise buckle a distribution of superabrasive particles arranged on just one side. By applying a monolayer to each side of the metal support layer, warping forces such as thermal movement and pressure can be equalized or substantially equalized on both sides. As such, the warpage of the metal support layer can be minimized. In other words, the forces responsible for warping are applied substantially equally to each side of the metal layer and can thus at least partially cancel one another out, thus minimizing warpage that can otherwise occur. In some aspects, the superabrasive particles making up the monolayers on each side of the metal layer can have matching configurations, patterns, or orientations to one another. In this way there can be a substantially matching spatial arrangement of superabrasive particles on each side of the metal layer. In another aspect, the configurations, patterns, or orientations can be different or varied from one another, or may be partially matching. In yet another aspect, the patterned placement of the superabrasive particles on one side of the metal support layer can be substantially aligned with the pattern of superabrasive particles on the other side of the metal layer so that particle locations match one another. In some aspects, there can be a direct correspondence between the spatial positioning of superabrasive particles on one side of the metal support layer and the spatial positioning of superabrasive particles on the other side of the metal support layer. In another aspect, the patterns of superabrasive particles may match or substantially match one another, but may be offset on opposite sides of the metal support layer so that particle locations do not match one another.

Figure 3:
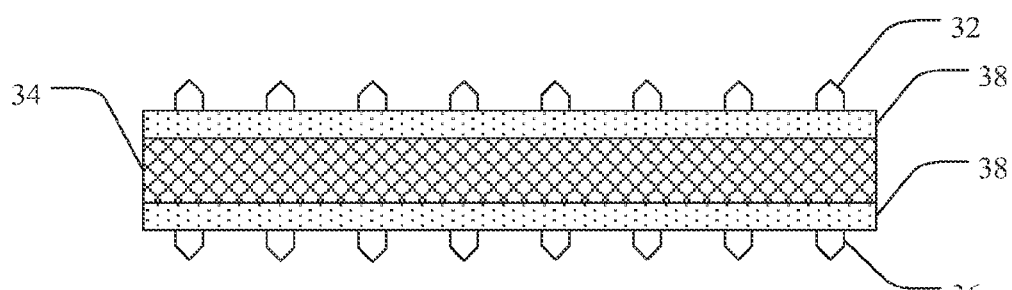
FIG. 3 is a schematic side view of a CMP pad dresser in accordance with an embodiment of the present invention.

In another aspect, as is shown in FIG. 3, a first monolayer of superabrasive particles 32 is arranged on a surface of a metal support layer 34. A second monolayer of superabrasive particles 36 is arranged on the metal support layer 34 on a side that is opposite to the first monolayer. A bonding material 38 secures the first monolayer and the second monolayer to the metal support layer 34. The bonding material can be any material capable of securing the first and second monolayer to the metal support layer. In some aspect, the bonding material can be the same for securing the first monolayer and the second monolayer, while in other aspects, the bonding material can be different for securing the first monolayer and the second monolayer.

The bonding material can be any material capable of securing superabrasive particles therein. Non-limiting examples of bonding materials include metal brazes, metal braze alloys, organic matrix materials, sintered materials, electroplated materials, and the like, including combinations thereof.

In one aspect, for example, the superabrasive particles can be brazed to the metal support layer, and thus the bonding material can be a metal braze or metal braze alloy. Metal brazing techniques are known in the art. A green braze material can be applied to the metal support layer on or around the superabrasive particles. The metal braze can be applied in any know configuration, including braze sheets, powders, pastes, sprays, and the like, including combinations thereof. Once applied to the metal support layer, the braze can be heated and melted to coat at least a portion of the metal support layer and to bond the superabrasive particles. The heating temperature can vary depending on the braze material used, but in one aspect can be from about 700° C. to about 1200° C. The superabrasive particles in the first and second monolayer are thus arranged such that thermal forces exerted on the metal support layer during heating and cooling are substantially equalize in order to minimize warping.

In one non-limiting example, the superabrasive particles can be bonded to the metal support layer by brazing with a nickel-based alloy containing chromium. In another example, the brazing can include pressing the superabrasive particles with a flat ceramic material that cannot be bonded to the braze in order to level the superabrasive particle tips. Various braze alloys are contemplated, including non-limiting examples such as $BNi_2$, $BNi_7$, and the like.

Additionally, in one aspect at least one of the first and second monolayers of superabrasive particles can be coupled to the metal support layer by an electrodeposition process, and thus the bonding material can be an electrodeposited metal material. As an example of a suitable method for positioning and retaining abrasive materials prior to and during the electrodeposition process, a mold can be used that includes an insulating material that can effectively prevent the accumulation of electrodeposited material on the molding surface. Superabrasive particles can be held on the molding surface of the mold during electro deposition. As such, the accumulation of electrodeposited material can be prevented from occurring on the particle tips and the working surface of the pad conditioner substrate. Such techniques are described in U.S. patent application Ser. No. 11/292,938, filed Dec. 2, 2005, which is hereby incorporated herein by reference.

In another aspect, the superabrasive particles can be bonded to the metal support layer by sintering, and thus the bonding material can include a sintering material. For example, the bonding of the superabrasive particles to the metal support layer can include disposing a sintering compound on the metal support layer in contact with at least one of the first monolayer and the second monolayer and sintering the sintering compound to bond the at least one of the first monolayer and the second monolayer to the metal support layer. Suitable sintering methods will be readily appreciated by one of ordinary skill in the art having possession of this disclosure. Basically, a sintering compound is applied around the superabrasive particles and in contact with the metal support layer. The sintering compound can be any known sintering material that can be used to secure superabrasive particles to a substrate. Non-limiting examples of such materials can include metal and metal alloy powders, ceramic powders, and the like. One specific non-limiting example of a sintering compound is cobalt powder.

Once the sintering compound has been applied around the superabrasive particles and to the metal support substrate, heat and in some cases pressure can be applied to cause sintering to occur. In some aspects, a braze or braze alloy can be infiltrated into the sintering compound during bonding to further strengthen the bonding material matrix.

Figure 4:
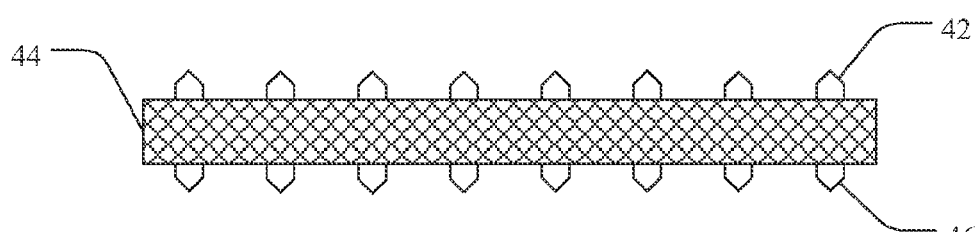
FIG. 4 is a schematic side view of a CMP pad dresser in accordance with an embodiment of the present invention.

In another aspect, as is shown in FIG. 4, heat and pressure can be applied to bond the first monolayer of superabrasive particles 42 and/or the second monolayer of superabrasive particles 46 directly into the metal support layer 44. Thus, upon the application of heat and pressure, the metal support layer 44 is softened or partially melted. The superabrasive particles in one or more of the monolayers are then pressed into the metal support layer. A planar leveling surface can be used to apply pressure to the monolayer and thus maintain the level nature of the superabrasive particle tips as the superabrasive particles are pressed into the metal support layer. Upon cooling, the distribution of superabrasive particles on either side of the metal support layer at least partially equalizes the thermal forces acting on the metal support layer, thus minimizing warping.

Figure 5:
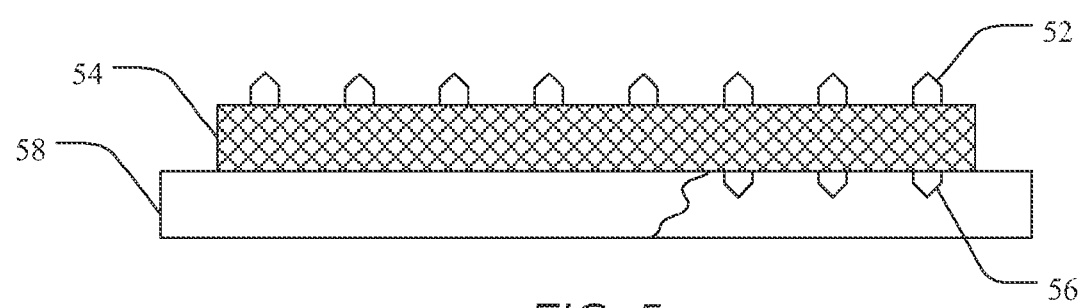
FIG. 5 is a schematic side view of a CMP pad dresser in accordance with an embodiment of the present invention.

In yet another aspect, as is shown in FIG. 5, a CMP pad dresser can include a first monolayer of superabrasive particles 52 and a second monolayer of superabrasive particles 56 coupled to a metal support layer 54. The superabrasive particles can be coupled to the metal support layer directly or via a bonding material. The second monolayer of superabrasive particles 56 is coupled to a rigid support 58. A portion of the rigid support 58 is shown removed in FIG. 5 to expose the second monolayer. The rigid support 58 can facilitate handling and use of the CMP pad dresser. By bonding the superabrasive particles of the second monolayer to the rigid support, the first monolayer of superabrasive particles remains exposed for CMP pad conditioning operations.

The rigid support can be made from any material compatible with the abrading or dressing process. Such materials can include polymeric materials, metal materials, ceramic materials, glasses, composites, and the like. In one aspect, the rigid support can be a polymeric material and the second monolayer of superabrasive particles can be embedded therein using heat, pressure, adhesives, etc. In some aspects, the rigid support can be a non-polymeric material such as a metal layer. In such cases, the superabrasive particles can be bonded to the rigid support by adhesive attachment, soldering, brazing, electroplating, and the like. For brazing techniques, care can be taken to minimize or eliminate warpage in the metal layer during the heating and cooling process. In another aspect, one or more magnetic elements can be placed into the rigid support to attract and hold the CMP pad dresser in place, thus forming a temporary attachment. An optional locking mechanism can be utilized to further immobilize the CMP pad dresser to the rigid support during use. In some aspects the rigid support can include surface features to hold the dresser in place during rotational movement against a CMP pad. The rigid support can have approximately the same diameter as the metal support layer, a larger diameter than the metal support layer, or, in some cases, a smaller diameter than the metal support layer.

In another aspect, a CMP pad dresser can be comprised of a plurality of dressing segments having a plurality of leveled superabrasive particles tips, where the plurality of dressing segments are held in place by a rigid support. Such a design allows a plurality of smaller dressing segments to be manufactured having precisely leveled tips. Smaller diameter metal support layers in these dressing segments can be made by processes involving heat and/or pressure with less warpage due to their smaller size. For example, a 4 inch diameter metal disc can exhibit greater warping due to brazing as compared to a 0.5 inch diameter metal disc. Thus thermal distortion and particle floating problems are decreased. A plurality of such dressing segments can then be coupled to a larger diameter rigid support by processes that do not introduce significant warpage, such as bonding in an organic material. Such dressing segments can have one or more layer(s) of superabrasive particles coupled to a support layer. In one aspect, a segment can have a single layer of superabrasive particles coupled to a metal support layer. In another aspect, a segment can have a layer of superabrasive particles coupled to each side of a metal support layer, as has been described herein. Thus, this process allows the manufacture of CMP pad dressers that can have precise tip protrusion tolerances. Additionally, in one aspect, each dressing segment can have at least three superabrasive particles that protrude to the greatest extent. If the three highest protruding superabrasive particles on every dressing segment are leveled across the entire rigid support, a CMP pad dresser is made having very precise tip leveling across the entire surface. If, for example, ten dressing segments are used to make the CMP pad dresser, then the highest protruding thirty superabrasive particles in the tool will have effectively the same protrusion distance and be substantially leveled. Various additional details regarding dressing segments are detailed in U.S. patent application Ser. No. 13/034,213, filed Feb. 24, 2011, which is hereby incorporated herein by reference.

Various organic materials are contemplated for use as a rigid support and/or to be used to secure the second monolayer of superabrasive particles and/or the dressing segments to the rigid support. Examples of suitable organic matrix materials include, without limitation, amino resins, acrylate resins, alkyd resins, polyester resins, polyamide resins, polyimide resins, polyurethane resins, phenolic resins, phenolic/latex resins, epoxy resins, isocyanate resins, isocyanurate resins, polysiloxane resins, reactive vinyl resins, polyethylene resins, polypropylene resins, polystyrene resins, phenoxy resins, perylene resins, polysulfone resins, acrylonitrile-butadiene-styrene resins, acrylic resins, polycarbonate resins, polyimide resins, and mixtures thereof. In one specific aspect, the organic material can be an epoxy resin. In another aspect, the organic material can be a polyimide resin. In yet another aspect, the organic material can be a polyurethane resin.

Additionally, so-called "reverse casting" methods can be used to accurately orient and attach the dressing segments to the rigid support. Such methods can include initially securing the plurality of dressing segments to a substrate using a "mask" material. The portions of the dressing segments protruding from the mask material can then be attached to the rigid support using the methods discussed herein, after which (or during which), the masking material can be removed.

When an organic material is utilized, methods of curing the organic material can be a variety of processes known to one skilled in the art that cause a phase transition in the organic material from at least a pliable state to at least a rigid state. Curing can occur, without limitation, by exposing the organic material to energy in the form of heat, electromagnetic radiation, such as ultraviolet, infrared, and microwave radiation, particle bombardment, such as an electron beam, organic catalysts, inorganic catalysts, or any other curing method known to one skilled in the art.

In one aspect of the present invention, the organic material can be a thermoplastic material. Thermoplastic materials can be reversibly hardened and softened by cooling and heating respectively. In another aspect, the organic material layer may be a thermosetting material. Thermosetting materials cannot be reversibly hardened and softened as with the thermoplastic materials. In other words, once curing has occurred, the process can be essentially irreversible, if desired.

As a more detailed list of what is described above, organic materials that may be useful in embodiments of the present invention include, but are not limited to: amino resins including alkylated urea-formaldehyde resins, melamine-formaldehyde resins, and alkylated benzoguanamine-formaldehyde resins; acrylate resins including vinyl acrylates, acrylated epoxies, acrylated urethanes, acrylated polyesters, acrylated acrylics, acrylated polyethers, vinyl ethers, acrylated oils, acrylated silicons, and associated methacrylates; alkyd resins such as urethane alkyd resins; polyester resins; polyamide resins; polyimide resins; reactive urethane resins; polyurethane resins; phenolic resins such as resole and novolac resins; phenolic/latex resins; epoxy resins such as bisphenol epoxy resins; isocyanate resins; isocyanurate resins; polysiloxane resins including alkylalkoxysilane resins; reactive vinyl resins; resins marketed under the Bakelite™ trade name, including polyethylene resins, polypropylene resins, epoxy resins, phenolic resins, polystyrene resins, phenoxy resins, perylene resins, polysulfone resins, ethylene copolymer resins, acrylonitrile-butadiene-styrene (ABS) resins, acrylic resins, and vinyl resins; acrylic resins; polycarbonate resins; and mixtures and combinations thereof. In one aspect of the present invention, the organic material may be an epoxy resin. In another aspect, the organic material may be a polyimide resin. In yet another aspect, the organic material may be a polyurethane resin.

Numerous additives may be included in the organic material to facilitate its use. For example, additional crosslinking agents and fillers may be used to improve the cured characteristics of the organic material layer. Additionally, solvents may be utilized to alter the characteristics of the organic material in the uncured state. Also, a reinforcing material may be disposed within at least a portion of the solidified organic material layer. Such reinforcing material may function to increase the strength of the organic material layer, and thus further improve the retention of the individual abrasive segments. In one aspect, the reinforcing material may include ceramics, metals, or combinations thereof. Examples of ceramics include alumina, aluminum carbide, silica, silicon carbide, zirconia, zirconium carbide, and mixtures thereof.

Additionally, in one aspect a coupling agent or an organometallic compound may be coated onto the surface of a superabrasive material to facilitate the retention of the superabrasive particles in the organic material via chemical bonding. A wide variety of organic and organometallic compounds is known to those of ordinary skill in the art and may be used. Organometallic coupling agents can form chemicals bonds between the superabrasive materials and the organic material, thus increasing the retention of the superabrasive materials therein. In this way, the organometallic coupling agent can serve as a bridge to form bonds between the organic material and the surface of the superabrasive material. In one aspect of the present invention, the organometallic coupling agent can be a titanate, zirconate, silane, or mixture thereof. The amount of organometallic coupling agent used can depend upon the coupling agent and on the surface area of the superabrasive material. Oftentimes, 0.05% to 10% by weight of the organic material layer can be sufficient.

Specific non-limiting examples of silanes suitable for use in the present invention include: 3-glycidoxypropyltrimethoxy silane (available from Dow Corning as Z-6040); γ-methacryloxy propyltrimethoxy silane (available from Union Carbide Chemicals Company as A-174); β-(3,4-epoxycyclohexyl)ethyltrimethoxy silane, γ-aminopropyltriethoxy silane, N-(β-aminoethyl)-γ-aminopropylmethyldimethoxy silane (available from Union Carbide, Shin-etsu Kagaku Kogyo K.K., etc.). Specific non-limiting examples of titanate coupling agents include: isopropyltriisostearoyl titanate, di(cumylphenylate)oxyacetate titanate, 4-aminobenzenesulfonyldodecylbenzenesulfonyl titanate, tetraoctylbis(ditridecylphosphite) titanate, isopropyltri(N-ethylamino-ethylamino) titanate (available from Kenrich Petrochemicals. Inc.), neoalkyoxy titanates such as LICA-01, LICA-09, LICA-28, LICA-44 and LICA-97 (also available from Kenrich), and the like. Specific non-limiting examples of aluminum coupling agents include acetoalkoxy aluminum diisopropylate (available from Ajinomoto K.K.), and the like. Specific non-limiting examples of zirconate coupling agents include: neoalkoxy zirconates, LZ-01, LZ-09, LZ-12, LZ-38, LZ-44, LZ-97 (all available from Kenrich Petrochemicals, Inc.), and the like. Other known organometallic coupling agents, e.g., thiolate based compounds, can be used in the present invention and are considered within the scope of the present invention.

In other aspects of the present disclosure, superabrasive particle tips can be leveled by reducing the protrusions of particles that are outside of the desired tolerance range. Once such particles are identified, various techniques can be utilized to reduce such protrusions. In one aspect, for example, mechanical abrasion of the dresser can reduce the protruding particles. In another aspect, a vibration tool can be used to individually break such particles. In yet another aspect, a laser such as a Nd:YAG laser can be used to disrupt such particles.

In another aspect of the present disclosure, a method of making a CMP pad dresser can include disposing a first monolayer of superabrasive particles on a metal support layer, and disposing a second monolayer of superabrasive particles on the metal support layer on a side opposite the first monolayer. The superabrasive particles of the second monolayer are positioned to have substantially the same distribution as the superabrasive particles of the first monolayer. The method can further include bonding the first monolayer of superabrasive particles and the second monolayer of superabrasive particles to the metal support layer such that symmetrical forces due to the substantially similar distribution between the first monolayer and the second monolayer precludes substantial warping of the metal support layer.

In yet another aspect, disposing at least one of the first monolayer of superabrasive particles or the second monolayer of superabrasive particles can include adhering a plurality of superabrasive particles to an adhesive transfer sheet in a predetermined pattern established by apertures in a template, and removing the template from the adhesive transfer sheet such that the plurality of superabrasive particles remain adhered to the adhesive transfer sheet in the predetermined pattern. The plurality of superabrasive particles is then transferred with the adhesive transfer sheet to the metal support layer, and the adhesive transfer sheet is removed from the plurality of superabrasive particles to form at least one of the first monolayer of superabrasive particles or the second monolayer of superabrasive particles.

In a further aspect of the present disclosure, a method of minimizing warpage of a CMP pad dresser during manufacture can include substantially equalizing warping forces on opposing sides of a metal support layer during bonding of a plurality of superabrasive particles thereto, wherein warpage of the support layer is minimized during bonding due to the equalized forces on opposing sides. In one aspect, substantially equalizing forces includes arranging the plurality of superabrasive particles on opposing sides of the support layer such that the plurality of superabrasive particles has substantially the same distribution on either side of the support layer to substantially equalize warping forces during bonding.

In yet a further aspect of the present disclosure, a CMP pad dresser can include a plurality of superabrasive particles arranged as a working surface, where the difference in protrusion distance between the highest protruding tip and the second highest protruding tip of the first monolayer of superabrasive particles is less than or equal to about 20 microns, and where the difference in protrusion distance between the highest 1% of the protruding tips of the first monolayer of superabrasive particles, excluding the highest protruding tip, are within about 80 microns.

In another aspect, a CMP pad dresser can include a plurality of superabrasive particles arranged as a working surface, where the difference in protrusion distance between the highest protruding tip and the second highest protruding tip is less than or equal to about 10 microns, the difference in protrusion distance between the highest protruding tip and the 10$^{th}$ highest protruding tip is less than or equal to about 20 microns, the difference in protrusion distance between the highest protruding tip and the 100$^{th}$ highest protruding tip is less than or equal to about 40 microns, and the highest protruding tip has a protrusion distance of greater than or equal to about 50 microns.

It is noted that, while the above disclosure refers primarily to CMP pad dressers, other precision grinding and/or abrading tools are considered to be within the present scope. As such, the techniques and teaching disclosed herein can additionally be applied to such tools.

Additionally, it is noted that traditional CMP processing techniques, including pad dressing, has limited the critical dimension of integrated circuits. The presently disclosed CMP dressing devices and techniques can, however, allows processing of wafers having integrated circuit critical dimensions of less than or equal to 45 nm, 32 nm, 28 nm, or 22 nm.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A CMP pad dresser, comprising:
    a first monolayer of superabrasive particles disposed on and protruding from one side of a metal support layer, wherein the difference in protrusion distance between the highest protruding tip and the second highest protruding tip of the monolayer of superabrasive particles is less than or equal to about 50 microns;
    a second monolayer of superabrasive particles disposed on the metal support layer on an opposite side from the first monolayer, wherein the superabrasive particles of the second monolayer are positioned to have substantially the same distribution as the superabrasive particles of the first monolayer; and
    a rigid support coupled to the second monolayer of superabrasive particles opposite the first monolayer.

2. The dresser of claim 1, wherein the plurality of superabrasive particles are arranged in at least one annular configuration having a central region devoid of superabrasive particles.

3. The dresser claim 1, wherein the plurality of superabrasive particles are configured in an attitude having a sharp portion oriented towards a pad to be dressed.

4. The dresser of claim 1, wherein the plurality of superabrasive particles are substantially all configured in an attitude having either an apex or an edge portion oriented toward a pad to be dressed.

5. The dresser of claim 1, wherein the difference in protrusion distance between the highest protruding tip and the second highest protruding tip of the first monolayer of superabrasive particles is less than or equal to about 10 microns.

6. The dresser of claim 5, wherein the difference in protrusion distance between the highest protruding tip and the 10$^{th}$ highest protruding tip of the first monolayer of superabrasive particles is less than or equal to about 20 microns.

7. The dresser of claim 6, wherein the difference in protrusion distance between the highest protruding tip and the 100$^{th}$ highest protruding tip of the first monolayer of superabrasive particles is less than or equal to about 40 microns.

8. The dresser of claim 1, wherein the difference in protrusion distance between the highest protruding tip and the second highest protruding tip of the first monolayer of superabrasive particles is less than or equal to about 20 microns.

* * * * *